US010934812B2

(12) United States Patent
Lynch et al.

(10) Patent No.: US 10,934,812 B2
(45) Date of Patent: Mar. 2, 2021

(54) INTEGRATED A PRIORI UNCERTAINTY PARAMETER ARCHITECTURE IN SIMULATION MODEL CREATION

(71) Applicant: LANDMARK GRAPHICS CORPORATION, Houston, TX (US)

(72) Inventors: Joe Lynch, Katy, TX (US); Travis Ramsay, Katy, TX (US)

(73) Assignee: Landmark Graphics Corporation, Houston, TX (US)

( * ) Notice: Subject to any disclaimer, the term of this patent is extended or adjusted under 35 U.S.C. 154(b) by 500 days.

(21) Appl. No.: 15/541,320

(22) PCT Filed: Jan. 30, 2015

(86) PCT No.: PCT/US2015/013819
§ 371 (c)(1),
(2) Date: Jun. 30, 2017

(87) PCT Pub. No.: WO2016/122611
PCT Pub. Date: Aug. 4, 2016

(65) Prior Publication Data
US 2018/0016876 A1  Jan. 18, 2018

(51) Int. Cl.
*E21B 41/00* (2006.01)
*G06F 30/20* (2020.01)
(Continued)

(52) U.S. Cl.
CPC .......... *E21B 41/0092* (2013.01); *E21B 43/00* (2013.01); *G05B 17/02* (2013.01);
(Continued)

(58) Field of Classification Search
CPC ...... E21B 41/0092; E21B 43/00; E21B 47/06; E21B 47/065; E21B 49/00; E21B 49/08; G05B 17/02; G06F 17/5009
See application file for complete search history.

(56) References Cited

U.S. PATENT DOCUMENTS

2005/0149307 A1* 7/2005 Gurpinar ............... E21B 43/00
703/10
2007/0168170 A1  7/2007 Thomas
(Continued)

FOREIGN PATENT DOCUMENTS

EP         2811107       12/2014
WO      2014022317        2/2014

OTHER PUBLICATIONS

Yin, Xing-Yao, Rui-Ying Sun, Bao-Li Wang, and Guang-Zhi Zhang. "Simultaneous inversion of petrophysical parameters based on geostatistical a priori information." Applied Geophysics 11, No. 3 (2014): 311-320. (Year: 2014).*

(Continued)

*Primary Examiner* — Chuen-Meei Gan
(74) *Attorney, Agent, or Firm* — Locke Lord LLP

(57) ABSTRACT

Method and system for optimizing production from an oil and gas reservoir includes selecting a geocellular grid representing at least one property of the reservoir, defining a data range for the property that reflects uncertainty regarding which values may be used for the property, defining a first reservoir simulation model, simulating production from the reservoir with the model using the at least one property, comparing the output of the simulated production from the reservoir with a predetermined criteria based on historical data, and modifying the property to a different value within the data range for the property if the predetermined historical criteria is not met. These steps may be repeated for at least two values for the property within the data range. The above may be repeated for a second reservoir model and the outputs of the simulated production for the models may then be ranked according to predefined criteria.

20 Claims, 7 Drawing Sheets

(51) Int. Cl.
*G05B 17/02* (2006.01)
*E21B 43/00* (2006.01)
*E21B 47/07* (2012.01)
*E21B 47/06* (2012.01)
*E21B 49/00* (2006.01)
*E21B 49/08* (2006.01)

(52) U.S. Cl.
CPC .............. *G06F 30/20* (2020.01); *E21B 47/06* (2013.01); *E21B 47/07* (2020.05); *E21B 49/00* (2013.01); *E21B 49/08* (2013.01)

(56) References Cited

U.S. PATENT DOCUMENTS

| | | | |
|---|---|---|---|
| 2008/0208539 A1* | 8/2008 | Lee | E21B 49/00 703/1 |
| 2009/0110242 A1* | 4/2009 | Touati | G06K 9/00 382/109 |
| 2010/0088078 A1* | 4/2010 | Geehan | G06F 30/20 703/2 |
| 2010/0161300 A1 | 6/2010 | Yeten et al. | |
| 2010/0250216 A1* | 9/2010 | Narr | G06F 17/5018 703/10 |
| 2010/0299126 A1* | 11/2010 | Chugunov | G01V 11/00 703/10 |
| 2011/0313737 A1* | 12/2011 | Hadj-Sassi | G01V 99/005 703/2 |
| 2012/0290277 A1 | 11/2012 | Thorne et al. | |
| 2013/0110483 A1* | 5/2013 | Chugunov | G01V 99/005 703/10 |
| 2013/0180327 A1 | 7/2013 | Frederick | |
| 2015/0153476 A1* | 6/2015 | Prange | G06F 17/10 703/2 |

OTHER PUBLICATIONS

CMG Computer Modeling Group, Ltd., "Pre Processor Simulation Mode Building Tool", downloaded from http://www.cmgl.ca/Builder on Jul. 10, 2017.
CMG Computer Modeling Group, Ltd., "Integrated Analysis & Optimization Tool", downloaded from http://www.cmgl.ca/cmost on Jul. 10, 2017.
Halliburton, "Decision Management System", downloaded from https://www.landmark.solutions/Decision-Management-System on Jul. 10, 2017.
Halliburton, "Nexus Suite Reservoir Simulation", downloaded from https://www.landmark.solutions/Nexus-Reservoir-Simulation on Jul. 10, 2017.
French Search Report for French Patent Application FR1562388 dated Apr. 9, 2018.
Canadian Search Report for Canadian Patent Application 2972391 dated Mar. 8, 2018.

* cited by examiner

INTEGRATED A PRIORI UNCERTAINTY PARAMETER ARCHITECTURE IN SIMULATION MODEL CREATION

TECHNICAL FIELD

The embodiments disclosed herein relate generally to the field of petroleum reservoir exploitation, and more particularly, to systems and methods for evaluating a reservoir using computer models that include uncertainty parameter analysis and sensitivity analysis.

BACKGROUND

Many factors may affect the development of oil and gas fields. To increase the production and profitability of an oil and gas field, reservoir simulation models may be created to allow reservoir engineers to plan and manage the fields. It is difficult to know in advance all of the parameters that may affect project design, such as the permeability and porosity of the underlying formation, the properties of the hydrocarbons expected to be recovered, the final realization of the surface facilities and number of wells, and the fluid-rock data. Therefore, reservoir simulation models may be tested against historical data or have a simulation of production predicted for a well or wells in the reservoir. Methods for analyzing reservoir parameter uncertainty and sensitivity may also be applied to the reservoir simulation model after it is created.

DETAILED DESCRIPTION OF DISCLOSED EMBODIMENTS

Figure 1:
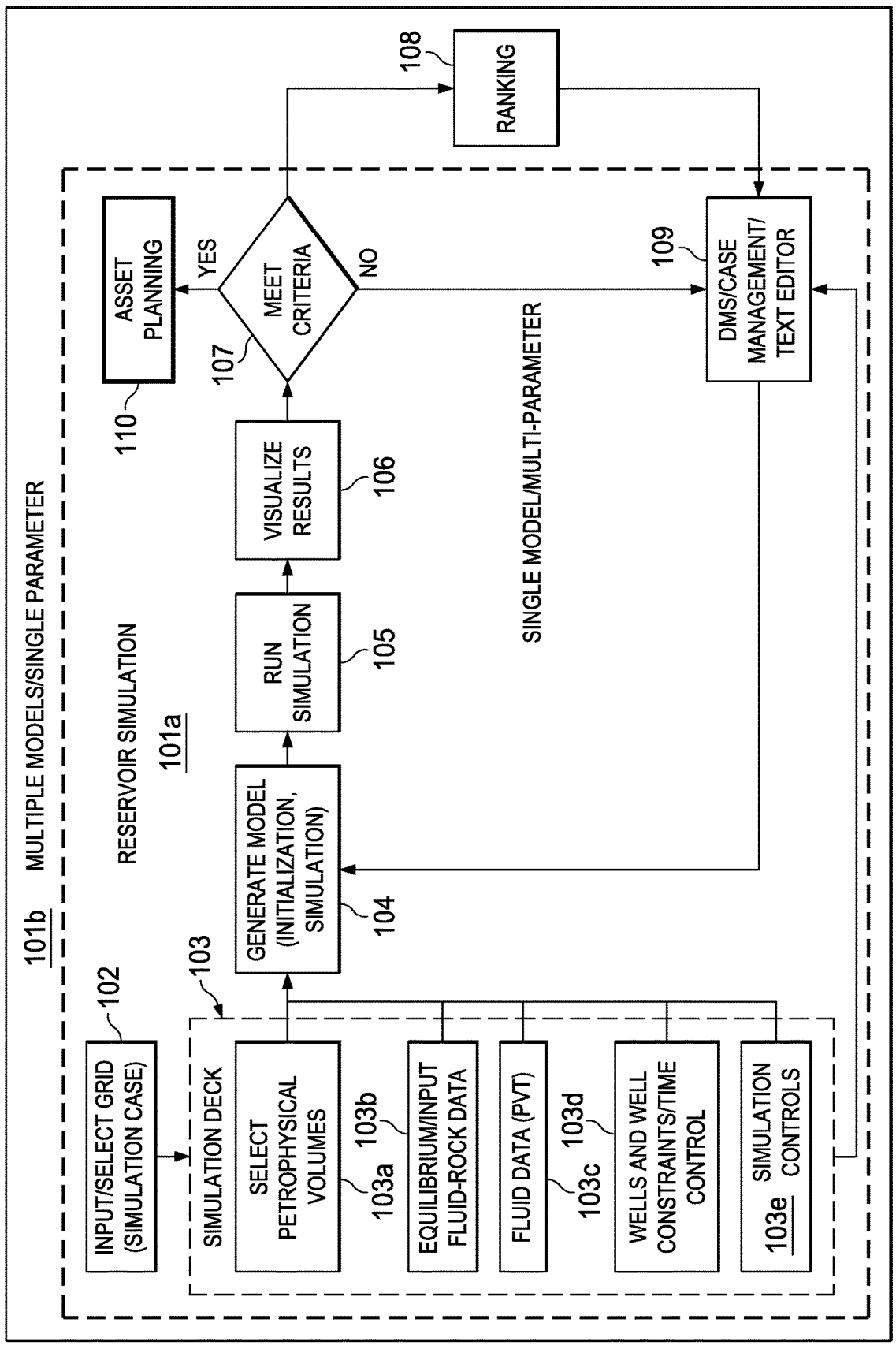
FIG. 1 is a diagram illustrating a work flow according to an embodiment of the disclosure.

As an initial matter, it will be appreciated that the development of an actual, real commercial application incorporating aspects of the disclosed embodiments will require many implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the disclosure.

In one or more embodiments there is disclosed a method for creating a simulation model of an oil and gas field having integrated uncertainty and sensitivity analysis. Simulation models are used to facilitate development of oil and gas fields by simulating the expected outputs from the field given a set of inputs reflecting information about the field. The data for the simulation model input may often contain uncertainty due to an incomplete understanding or knowledge about the reservoir. For example, there may be uncertainly about the range of values for one or more input parameters for the reservoir simulation model. As well, the reservoir may be more sensitive to one or more input parameters such that variations in these input parameters may create more significant variations in the output of the reservoir simulation model relative to other input parameters. The embodiments disclosed herein provide an integrated approach to analyzing and modeling such reservoir parameter uncertainty and sensitivity, as discussed further herein.

Examples of parameters that may be input to the reservoir simulation model include information about the petrophysical volume of the field, which may include parameters like the expected permeability and porosity in the formation. Such information may reside in a database containing data for the various petrophysical properties of the field. The input may also include information about the fluid description data for the field, which may include parameters like the composition of the fluid, and the fluid model used in the simulation. It may also include information about the equilibrium and fluid-rock data, such as the reservoir constraints and initial parameters. The data for the simulation model may further include information about the well and well constraints. Much of this type of data is static, such as the well name and location. However, other data may vary with time, such as whether the well is an injection well or a producer well, or the status of perforation intervals. Still further data that may be provided to the simulation model includes information regarding the surface facilities and whether the field contains multiple reservoirs. This category of information may include information about the number and types of compressors in the field, for example. And the input for the simulation model may also include information regarding the simulation controls in the field, for example, information about whether the controls are automatic or constant, and the time stepping method used by the controls.

In one embodiment, the method uses information generated by an oilfield modeling software application. An example of suitable oilfield modeling software includes the DecisionSpace® Earth Modeling application, which is a module of the DecisionSpace® Geosciences suite, available from Halliburton Energy Services, Inc. The DecisionSpace® Earth Modeling application is a subsurface tool that integrates subsurface data from well logs, cores, and seismic surveys, along with qualitative data to construct a 3D representation of a reservoir. The application may also use both stochastic and deterministic approaches to create a geocellular model of a reservoir. Geocellular models employ grids, each geocellular grid having a plurality of cells ("geocells") representing a predefined section or volume of the reservoir, to produce a model of the reservoir that reflects the geological, geophysical, petrophysical, fluid, rock, and other parameters for the reservoir. The DecisionSpace® Earth Modeling application, and other suitable applications, may use a 2D or 3D geocellular grid reflecting various properties used by a simulation model, such as porosity, structural depth, elevation, thickness, net-to-gross, and so forth. These properties may be stored at the center of each cell for 3D grids (cell-centered). The grid rotation may be based on the geological definition of azimuth where zero degrees equals north. The grid azimuth is defined as zero degrees plus or minus the rotation value. The geocellular grid may be stored in computer memory using, for example, the VDB storage format from Halliburton Energy Services, Inc., or other suitable format.

Many of the properties that may be used by the simulation model, such as permeability and porosity, are not known with accuracy when the simulation model is created, and contain an element of uncertainty, as alluded to above. Other properties used by the simulation model may be known in advance, such as whether a particular well is an injection or a producer well, but these properties may change over time. Embodiments of the disclosure allow the incorporation of an a priori or previously obtained uncertainty assessment at the initial creation of the simulation model, rather than creating a simulation model that maintains an explicit solitary parameterization for all input data requirements. For example, simulation models may vary input parameters based on a predefined constraint on the distribution of the parameter, such as Gaussian, Log-Normal, or Triangular distribution. Varying the input parameters may also produce a sensitivity analysis on the particular parameter being varied as it relates to the simulation model.

FIG. 1 is a workflow diagram of a method according to an embodiment of the disclosure. In this implementation, the method begins with the steps depicted in block 101a, which illustrate a single model/multi-parameter process. The single model/multi-parameter phase of the disclosure begins with block 102, in which a user defines a dynamic simulation case 103 (i.e., simulation instance) by selecting or inputting a geocellular grid which has a reservoir (i.e., porous media through which fluid flow will be modeled) parameterized with petrophysical property arrays possessing a minimum of porosity and permeability arrays. The grid and petrophysical property models may be defined or created in, for example, DecisionSpace® or similar applications such that each simulation case 103 may have its own set of parameterized petrophysical properties. This information is then referenced by the simulation case 103 which contains blocks 103a-103e that may be provided as an input to the model generator 104. These data blocks 103a-103e may include information about the different categories of data contained in the geocells used by the model generator and their properties. For example, block 103a contains information regarding the petrophysical volumes to be used by the model generator 104. Block 103b contains information regarding the equilibrium/fluid-rock data. Block 103c contains information about the fluid data. Block 103d contains information about the wells and well constraints, as well as the time control. Block 103e contains information regarding the simulation controls to be used for the numerical reservoir model.

The simulation case 103 is then provided to the model generator 104. A suitable model generator may be, for example, the Nexus® SimDataStudio application available from Halliburton Energy Services, Inc. Applications such as Nexus® SimDataStudio allow the user to define or select a simulation model from several available simulation models to be used to simulate the reservoir. The model generator block 104 then generates a suitable input model for the run simulator 105 based on the data defined or inputted in the simulation deck 103. The input model from model generator 104 also typically contains information necessary for the numerical flow simulation to be executed in block 105, such as the initialization and other simulation parameters. The output of the run simulation block 105 may then be used by an operator to visualize, via a suitable display, the results of the run simulation as shown in block 106.

Following block 106, it is determined whether the model created in the run simulation block 105 meets one or more criteria predetermined by the well operator. These criteria may include, for example, the accuracy of the simulation model with respect to production history or the outcome of simulated production scenarios for asset production forecasting—depending on the workflow being followed. The criteria may also involve determining how closely the model matches pressure at the well(s) and/or field, as well as produce rates and cumulative volume, with production history. If the one or more criteria are met, then the method may proceed to block 108 or block 110, depending on whether a history matching workflow or a prediction workflow is used. If a history matching workflow is used, then in block 108, the models may be ranked by produced volume. If a prediction workflow is used, then in block 110, the models are used for asset planning. For results that do not meet the one or more criteria in block 107, flow may proceed to block 109 for modification of the input parameters, as discussed further below.

Figure 2:
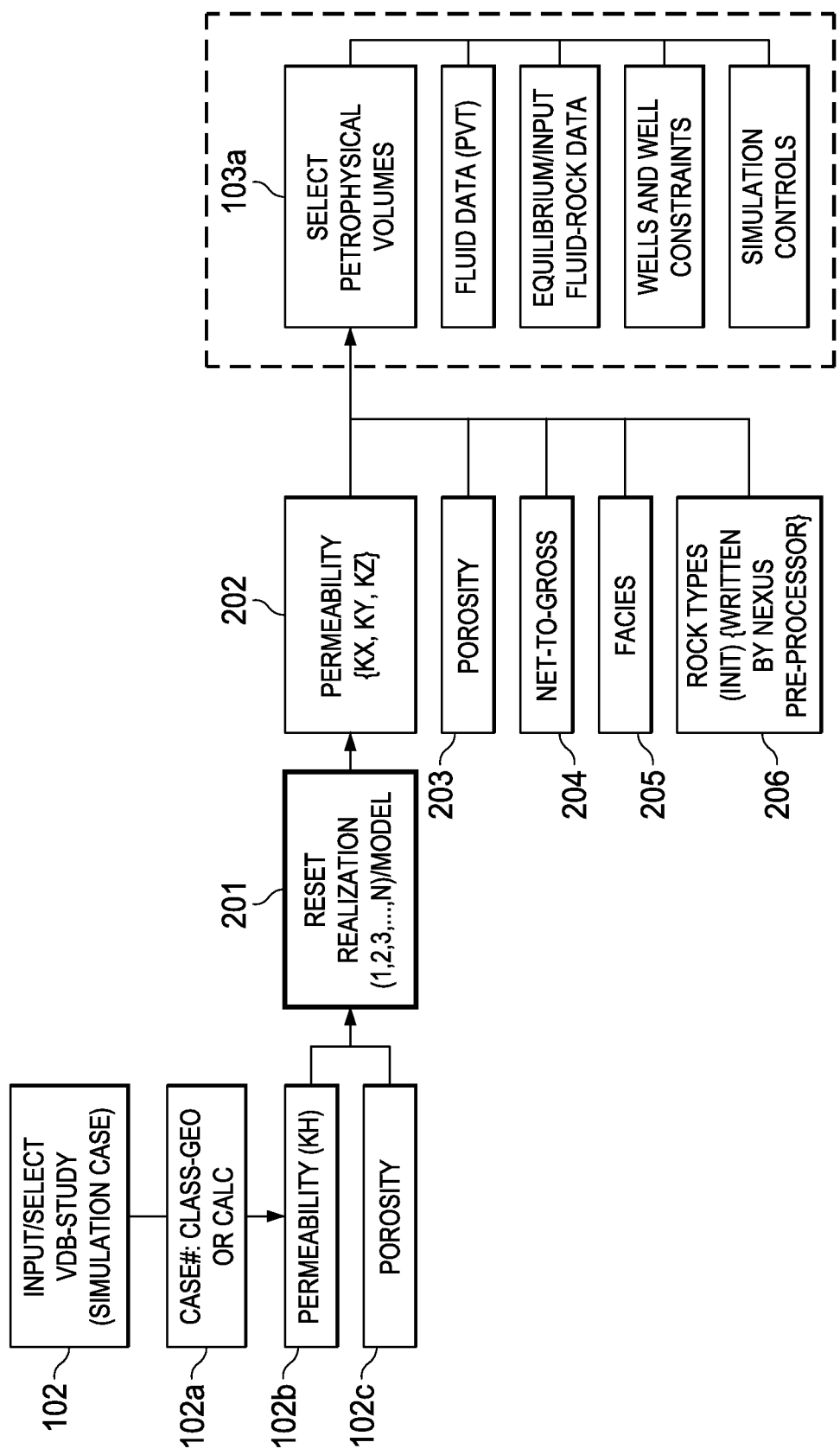
FIG. 2 is a diagram illustrating a data flow for petrophysical volume information according to an embodiment of the disclosure.

FIGS. 2-6 are data flow diagrams that show in more detail the information contained in simulation case 103. FIG. 2 shows a data flow diagram for providing the petrophysical volume information in block 103a of input case 103. The initial information may be originally generated in an earth modeling algorithm, such as DecisionSpace Geosciences®. The output from the earth modeling algorithm is represented by block 102, for example, in VDB format. From this data, information is extracted reflecting the parameters generated by the earth model output, such as permeability in the horizontal direction (KH), and porosity as shown in blocks 102b and 102c, respectively. This horizontal permeability can be further considered as a representation of X axis orientation permeability (KX) and Y axis orientation permeability (KY). The earth model output may contain numerous realizations, depending on the modeling process originally used by the geomodeler performing earth modeling. Multiple realizations are generated as a result of using stochastic methods while single models are generated as a result of using deterministic methods. Because of the large amount of data that must be eventually processed by the run simulator 105, it is advantageous to select the realizations most likely to represent the actual description of the subsurface and which best honor any known reservoir parameters. This subset of realizations is depicted in block 201. In one or more embodiments, determining the best realizations may be accomplished by selecting the model(s) that minimize the difference between simulated and known drainage characteristics on a field or individual well basis.

After any outlier realizations are removed, a subset of realizations are created, and the data flow proceeds to blocks 202 and 203. Block 202 contains the data representing the permeability of the rocks and the geocellular model. Permeability is generally assigned to each cell for the axial directions of the geocellular grid. Permeability information is required petrophysical volume data for the dynamic simulation model case 103.

Another block of required data for generating the simulation case in some embodiments is information regarding the porosity of the reservoir. This information is provided in block 203 and is required petrophysical property array data used in the simulation case 103.

Blocks 204-206 represent additional data that may optionally be provided to the petrophysical volume block of the simulation case 103. This data may include net-to-gross information in block 204, facies information in block 205, and information about the hydraulic or petrofacies rock types in block 206.

Figure 3:
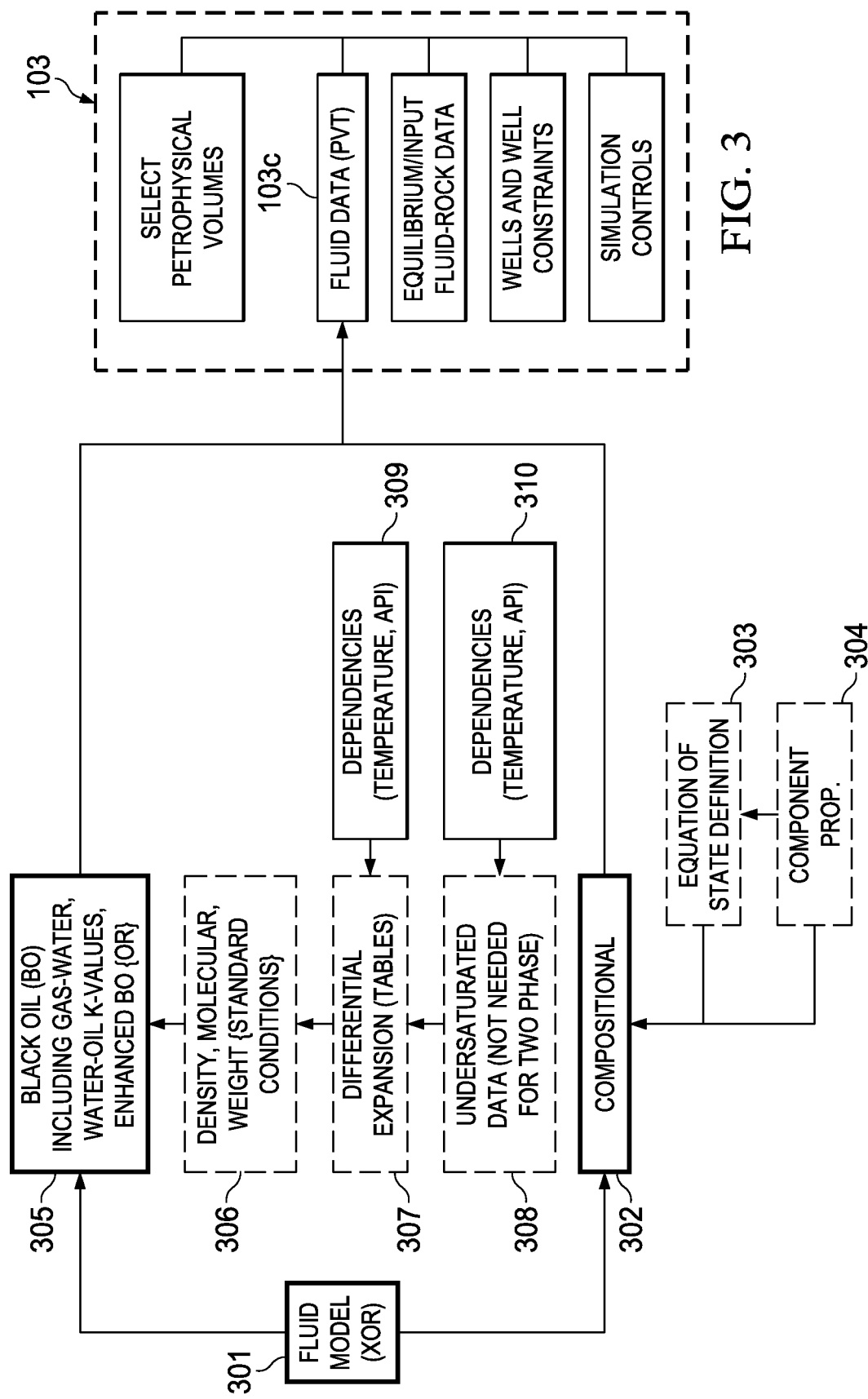
FIG. 3 is a diagram illustrating a data flow for the fluid model information according to an embodiment of the disclosure.

FIG. 3 is a data flow diagram according to an embodiment showing the data flow for the information comprising the fluid model data used by simulation case 103. Data flow for the fluid model data begins in block 301 in which the user selects the type of fluid model to use. In block 302, the user may select a compositional model which requires input provided from other data blocks, including the equation of state definition in block 303 and the component properties definition block 304. Alternatively, the user may select a black oil model, gas-water, water-oil, K-values, or enhanced black oil models. If the user selects a fluid model of type defined in block 305, then this model may be provided with data from blocks 306-308 which provides a fluid model 305 with information regarding the density, molecular weight, differential expansion, and gas saturation description. These models may, in turn, be provided with optional data to enhance their accuracy, such as any dependencies, for example, on temperature or API, as shown in blocks 309-310. Once the information in blocks 302-310 is compiled, it is then provided to the simulation case 103 in the fluid data block 103c.

Figure 4:
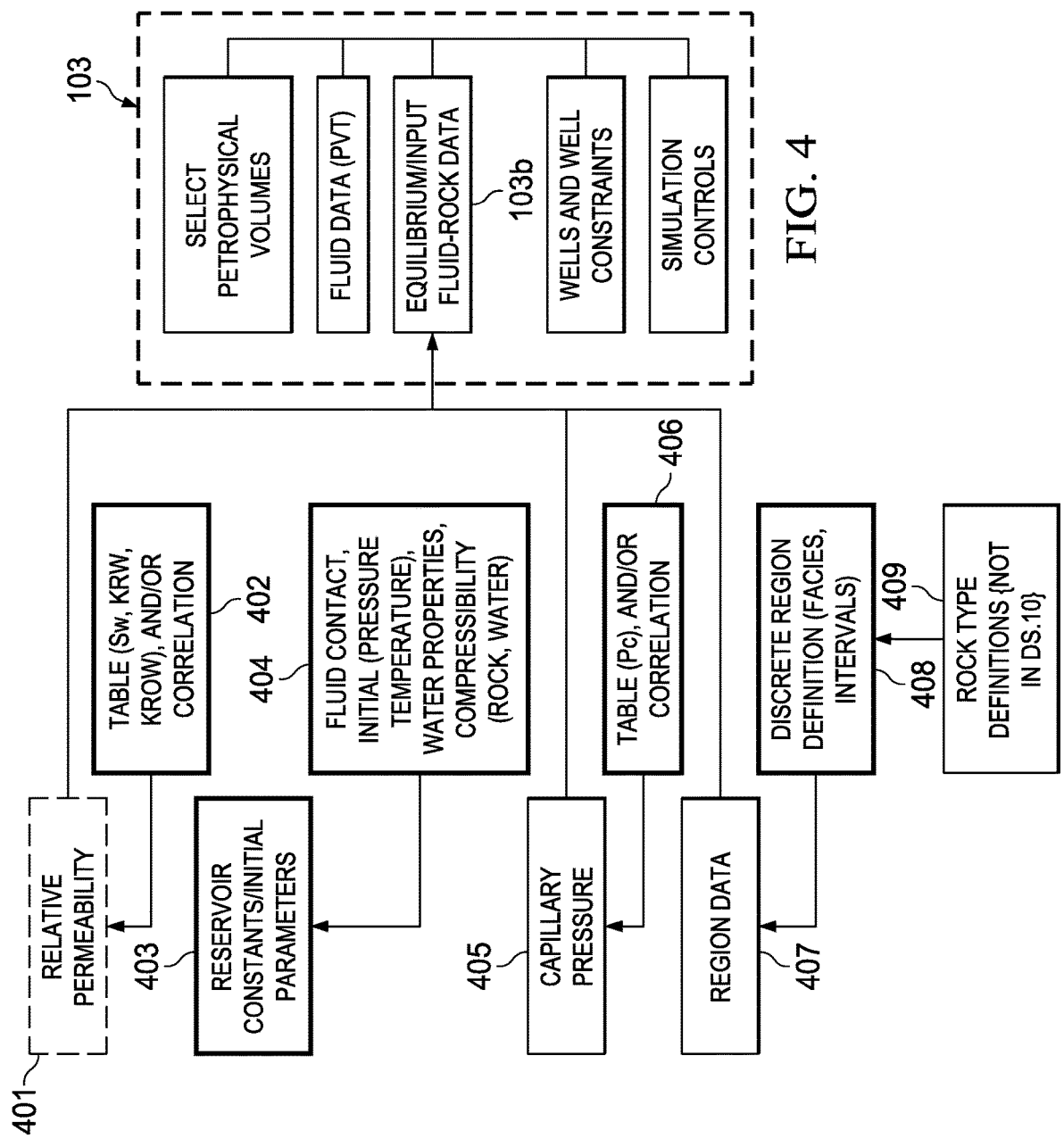
FIG. 4 is a diagram illustrating a data flow for the equilibrium/rock fluid information according to an embodiment of the disclosure.

FIG. 4 is a data flow diagram showing the data flow information concerning the equilibrium/rock-fluid to be used in the simulation case 103. This information includes the relative permeability in block 401 which is based upon the information shown in block 402. Block 403 contains information concerning the reservoir constants and initial parameters. This includes, for example, the data shown in block 404, such as fluid contact, initial pressure and temperature, the water properties in the formation, and the compressibility of the rock and depth of fluid contacts expected in the formation. The information in blocks 401-404 is typically required by the simulation case 103. Other information that may be provided includes the capillary pressure information shown in block 405, which can be determined using the correlation information in block 406. Block 407 describes region data which spatially differentiates discrete properties into subsets, for example, facies and intervals in block 408, and the rock type definitions (including hydraulic and petrofacies) in block 409. The data in blocks 401-409 is then provided to block 103c which provides the equilibrium and fluid-rock data for the simulation case 103.

Figure 5:
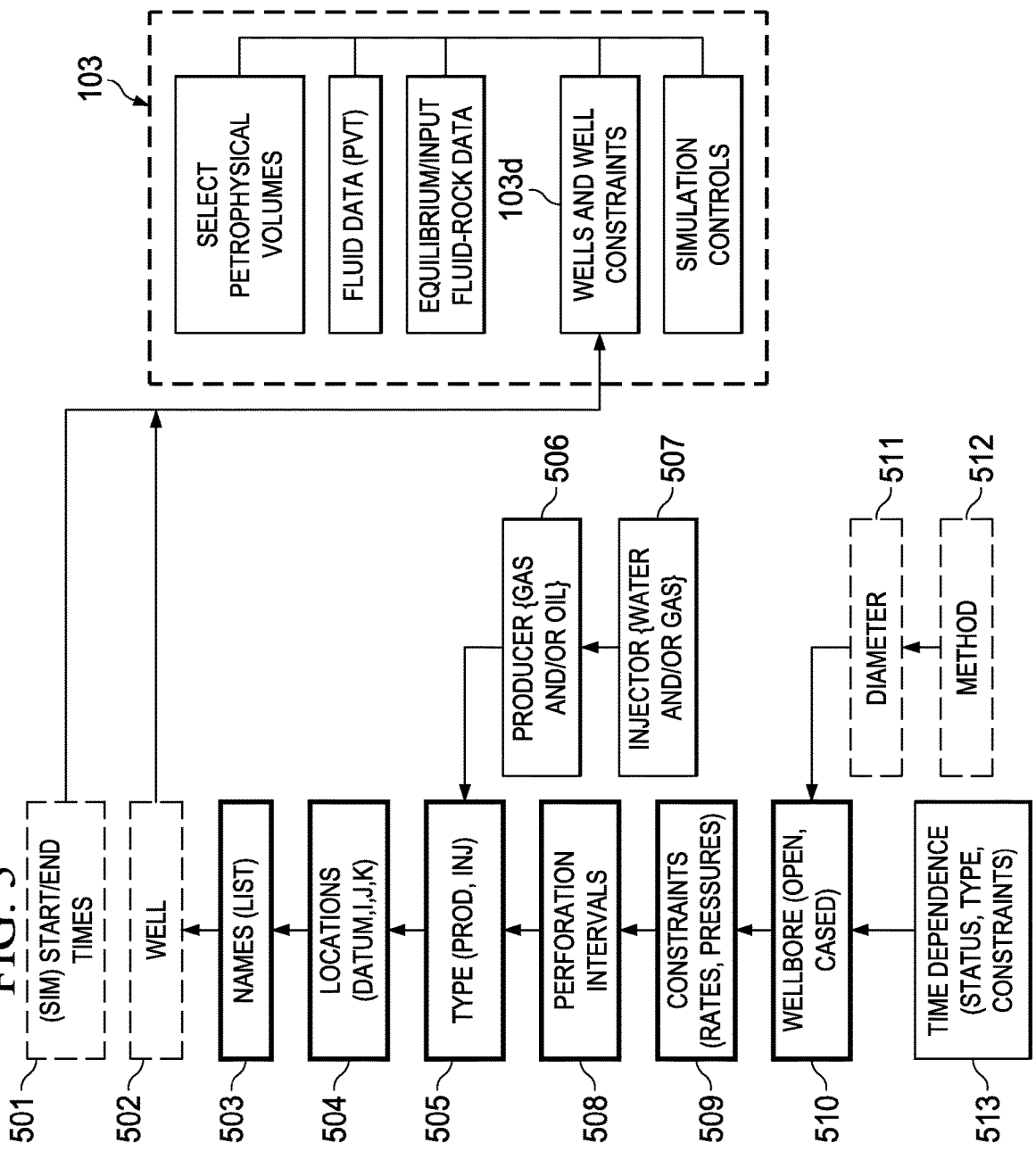
FIG. 5 is a diagram illustrating the data flow for the well/simulation time control information according to an embodiment of the disclosure.

FIG. 5 is a data flow diagram for the wells and simulation time control information used by the simulation case 103. This information includes the data in the start and ending times for the simulator in block 501, information about the well in block 502, for example, the name of the well or wells, provided in block 503, the locations of the wells provided in block 504, and the types of the wells, for example, production or injector wells, provided in block 505. This information may also include whether the well is producing gas or oil or whether, if an injector, it is injecting water and/or gas, as depicted in blocks 506-507, respectively. Other well information concerns the perforation intervals, the constraints regarding rates and pressures, and the type of well bore, for example, if it is open or cased. This information is provided in blocks 508-510, respectively. Additional detail about the well bore is provided in blocks 511-512 which provides the diameter of the well bores and the methods of constraining the operation of the well during the simulation. Other information may be provided such as the time dependence of well events as shown in block 513. Much of the information provided in blocks 501-513 is static information. For example, the names of the wells and their location is unlikely to change during the course of the reservoir simulations. Nevertheless, some of the data is time-dependent, for example, the type of the well provided in block 505 may change if the well goes from being a producer to an injector well. Or, the well may be perforated and the perforation intervals may change as the reservoir is produced. The information provided in blocks 501-513 is then provided to the simulation case 103 in the data block 103d for the well and well constraints information required by the simulation model builder 104 (see FIG. 1).

Figure 6:
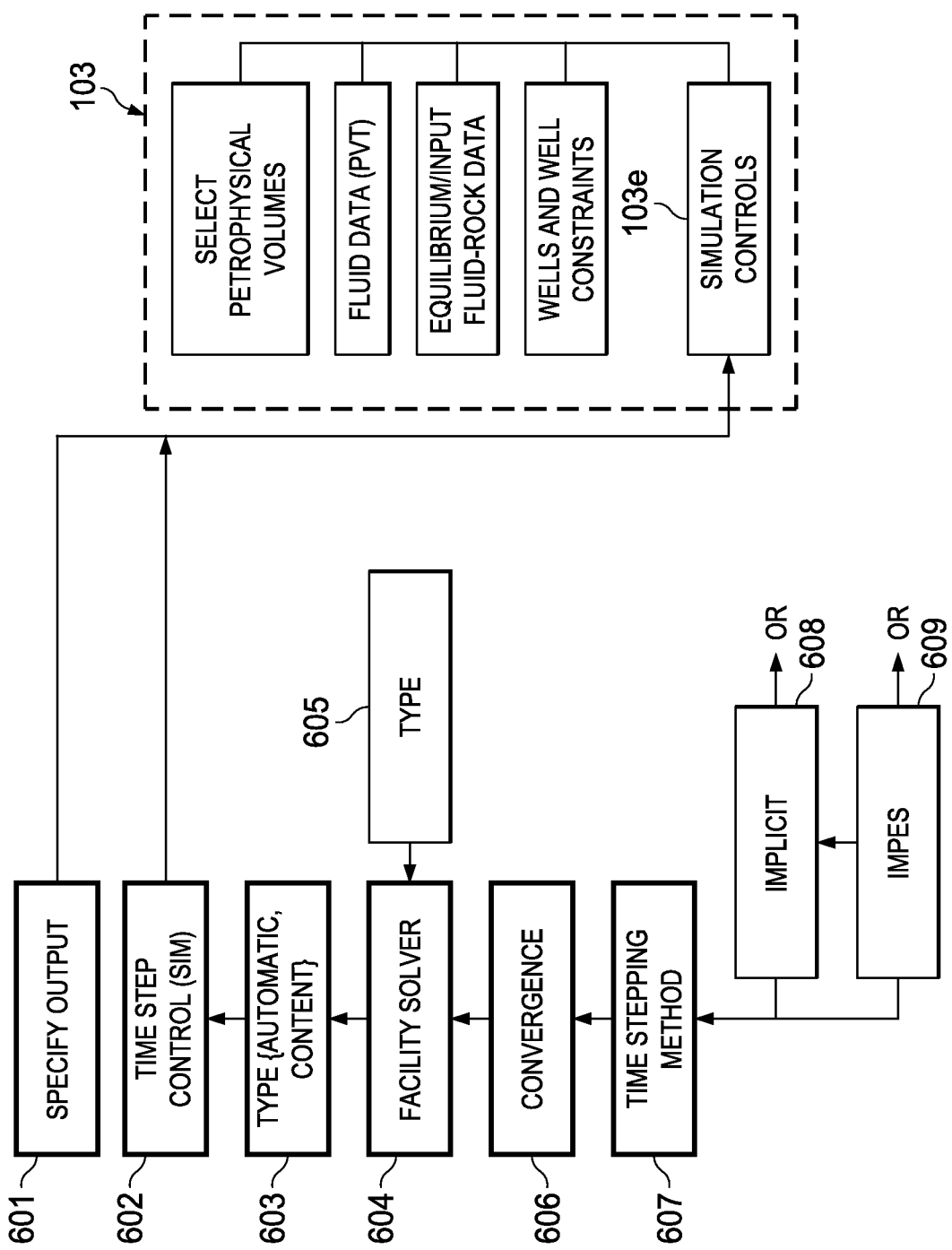
FIG. 6 is a data flow diagram illustrating the data flow for the simulation control information according to an embodiment of the disclosure.

FIG. 6 is a data flow diagram for the information block regarding the functional control of the simulation case 103 in block 103e. This information includes the output specification information in block 601. It may also include the time step control information in block 602 required by the simulation. The information in block 602 further includes the time-step type, for example, automatic or constant in block 603, the facility solver in block 604, which is informed by the type provided in block 605, the convergence and time stepping methods provided in blocks 606-607, and whether the time stepping method is implicit or IMPES (Implicit Pressure, Explicit Saturation), as shown in blocks 608-609. This data is then provided to the model builder 104 via data block 103e.

Referring again to FIG. 1, once the simulation case 103 is complete, using the data flow provided in FIGS. 2-7, the information in the simulation case 103 is then used to generate a computer model of the reservoir in the model builder block 104. This model may be generated by, for example, SimData Studio, which is an application within the Nexus® Desktop software, or any other suitable model building software. Once the model is generated, then simulations are executed in block 105 using, for example, the Nexus® software or similar simulators.

The parameters that make up various data blocks used in the simulation case 103 are not typically known with a high degree of accuracy before the model must be estimated. Therefore, these parameters are subject to possibly large amounts of uncertainty. As such, reservoir engineers may use separate applications to perform uncertainty analysis after an initial or several simulations have been executed. It may also be important for reservoir engineers to perform sensitivity analysis, allowing them to understand which variations in the input parameters create the most significant variations in the output of the reservoir simulation model. The standard application for performing sensitivity analysis is usually a separate software package which differs from the application originally used to create the simulation case. The use of separate applications to perform uncertainty analysis and sensitivity analysis may lead to inefficiency and operational complexity.

Embodiments of the disclosure allow the reservoir simulation model to include sensitivity analysis on the parameter uncertainty in the initial creation of the model by exposing sensitivity parameterization as a part of the simulation case creation in block 103. Referring again to FIG. 1, the embodiment allows ranges, including data value ranges, data type ranges, and the like, to be employed for the parameters provided in data blocks 103a-103e and used to create multiple simulation cases which are then processed in blocks 104-106. This results in the generation of multiple models which are then output for evaluation. The resulting models can then be subjected to the one or more workflow dependent criteria set forth in block 107, leading to the ranking block 108 when following a history matching workflow path or the asset planning block 110 when following a prediction workflow path. For results that do not meet the one or more criteria in block 107, flow may proceed to block 109 for changes to the simulation case.

Block 109 refers to changes that may need to be made to the simulation case as a result of previous simulation results. These changes can be made with any suitable application, including the DMS (Decision Management System) and Case Management applications from Halliburton Energy Services, Inc., or any other computer applications that can interface with a simulation deck associated with a simulation case, as well as any suitable text editor. Applications like DMS execute multiscenario optimization, sensitivity analysis, uncertainty assessment and facilitates history matching workflows.

The changes which are made can be to transmissibility multipliers, fluid model properties, fluid contacts, etc. Basically any variable associated with the generated simulation case with which sensitivity analysis is to be conducted may be changed. For example, with respect to the data flow for the petro-physical volume information described in FIG. 2, the permeability and porosity are not known with a high degree of accuracy. Therefore, multiple permeability and porosity arrays are provided in blocks 202-203, which are then provided to the simulation case 103 and the petrophysical volumes data block 103a. This creates multiple flow simulations cases within the work flow depicted in FIG. 1. The simulation results are representative of a described simulation model.

Figure 7:
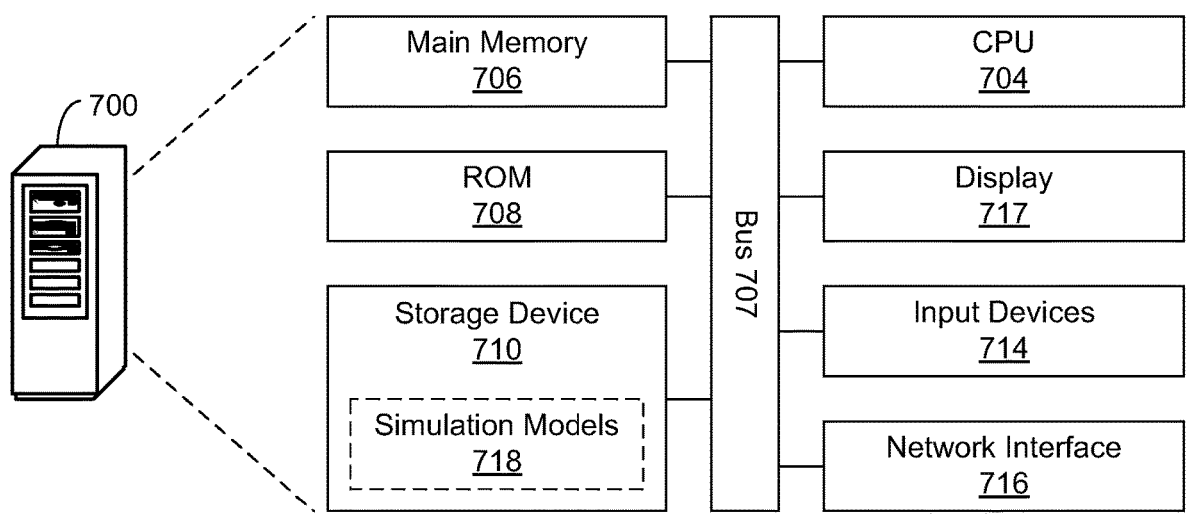
FIG. 7 is an exemplary system that may be used to implement various data flows for the simulation modeling according to an embodiment of the disclosure.

FIG. 7 illustrates an exemplary system 700 that may be used to implement the various simulation blocks described herein. As can be seen, the exemplary system 700 may be a conventional workstation, desktop, or laptop computer, or it may be a custom computing system 700 developed for a particular application. In a typical arrangement, the system 700 includes a bus 702 or other communication pathway for transferring information among other components within the system 700, and a CPU 704 coupled with the bus 702 for processing the information. The system 700 may also include a main memory 706, such as a random access memory (RAM) or other dynamic storage device coupled to the bus 702 for storing computer-readable instructions to be executed by the CPU 704. The main memory 706 may also be used for storing temporary variables or other intermediate information during execution of the instructions to be executed by the CPU 704. The system 700 may further include a read-only memory (ROM) 708 or other static storage device coupled to the bus 702 for storing static information and instructions for the CPU 704. A computer-readable storage device 710, such as a nonvolatile memory (e.g., Flash memory) drive or magnetic disk, may be coupled to the bus 702 for storing information and instructions for the CPU 704. The CPU 704 may also be coupled via the bus 702 to a display 712 for displaying information to a user. One or more input devices 714, including alphanumeric and other keyboards, mouse, trackball, cursor direction keys, and so forth, may be coupled to the bus 702 for communicating information and command selections to the CPU 704. A communications interface 716 may be provided for allowing the horizontal well design system 700 to communicate with an external system 100 or network.

The term "computer-readable instructions" as used above refers to any instructions that may be performed by the CPU 704 and/or other components. Similarly, the term "computer-readable medium" refers to any storage medium that may be used to store the computer-readable instructions. Such a medium may take many forms, including, but not limited to, non-volatile media, volatile media, and transmission media. Non-volatile media may include, for example, optical or magnetic disks, such as the storage device 710. Volatile media may include dynamic memory, such as main memory 706. Transmission media may include coaxial cables, copper wire and fiber optics, including wires of the bus 702. Transmission itself may take the form of electromagnetic, acoustic or light waves, such as those generated during radio frequency (RF) and infrared (IR) data communications. Common forms of computer-readable media may include, for example, magnetic medium, optical medium, memory chip, and any other medium from which a computer can read.

In accordance with the exemplary disclosed embodiments, one or more simulation models, simulation applications, and/or databases used to generate the models, indicated generally at 718, may also reside on or be downloaded to the storage device 710 for execution. In general, the one or more simulation models and/or simulation blocks are or include one or more computer programs that may be executed by the CPU 704 and/or other components to allow users to model a reservoir as described herein. Such computer programs may be implemented in any suitable computer programming language or software development package known to those having ordinary skill in the art, including various versions of C, C++, FORTRAN, and the like.

Accordingly, in general, the embodiments disclosed herein may be implemented in a number of ways. In some embodiments, a method may be provided for optimizing production from an oil and gas reservoir. The method may comprise selecting a geocellular grid, the geocellular grid including data representing petrophysical properties for the reservoir, and defining a data range for at least one of the petrophysical properties, the data range reflecting uncertainty regarding which values may be used for the at least one of the petrophysical properties. The method may also comprise selecting a first reservoir simulation model for the reservoir, simulating oil or gas production from the reservoir with the first reservoir simulation model using the petrophysical properties, and comparing an output of the simulated oil or gas production from the reservoir with a predetermined criterion. The method may further comprise modifying the at least one of the petrophysical properties to a different value within the data range if the criterion is not met, and repeating the simulation and comparison steps for two or more values of the at least one of the petrophysical properties that are within the data range. A second reservoir simulation model for the reservoir may then be selected, and the simulation, comparison, and modification steps may be repeated for the second reservoir simulation model. The outputs for the simulated productions from each of the first and second reservoir simulation models may then be ranked in some embodiments.

In some embodiments, the method may further comprise any one of the following features individually or any two or more of these features in combination: wherein the property of the reservoir comprises at least one of the permeability or porosity of the reservoir formation, the property of the reservoir comprises data representing the formation fluid, the property of the reservoir comprises data representing relative permeability, fluid pressure, fluid temperature, or capillary pressure of the reservoir formation, the property of the reservoir comprises at least one of the permeability or porosity of the reservoir formation, the property of the reservoir comprises static data reflecting an individual well location, or the property of the reservoir comprises data reflecting simulation controls for an individual well location.

One or more embodiments also may include a computer readable medium having data stored thereon representing a geocellular grid for an oil and gas reservoir, the geocellular grid including data representing one or more petrophysical properties for the reservoir, and a set of instructions that when executed causes a computer processor to perform a method for optimizing production from the reservoir. For example, the set of instructions may cause the computer processor to receive a data range for at least one of the petrophysical properties, the data range based on a priori uncertainty assessment of the reservoir, and receive a first reservoir simulation model for the reservoir. The set of instructions may also cause the computer processor to simulate production from the oil and gas reservoir with the first reservoir simulation model using the petrophysical properties for the reservoir, and compare an output of the simulated production from the oil and gas reservoir with a predetermined criterion. The set of instructions may also cause the computer processor to modify the at least one of the petrophysical properties to a different value within the data range if the criterion is not met, and repeat the simulation and comparison steps for two or more values of the at least one of the petrophysical properties that are within the data range. A second reservoir simulation model for the reservoir may be received, and the simulation, comparison, and modification steps may be repeated for the second reservoir simulation model. The outputs of the simulated productions for each of the first and second reservation models may then be ranked.

In some embodiments, the method may further comprise any one of the following features individually or any two or more of these features in combination: the property of the reservoir comprises at least one of the permeability or porosity of the reservoir formation, the property of the reservoir comprises data representing the formation fluid, the property of the reservoir comprises data representing relative permeability, fluid pressure, fluid temperature, or capillary pressure of the reservoir formation, the property of the reservoir comprises at least one of the permeability or porosity of the reservoir formation, the property of the reservoir comprises static data reflecting an individual well location, or the property of the reservoir comprises data reflecting simulation controls for an individual well location.

In one or more embodiments, a system for optimizing production from an oil and gas reservoir may include a computer processor and a database storing data representing one or more properties of an oil and gas reservoir and a geocellular model of the reservoir, the geocellular model composed of data representing at least one property of the reservoir, the database further storing a data range for the property and data representing a first reservoir simulation model. The system may further comprise a computer memory having computer executable instructions that when executed cause the computer processor to optimize production from an oil and gas reservoir. For example, the computer executable instructions may cause the computer processor to simulate production from the oil and gas reservoir with the first reservoir simulation model using the at least one property of the reservoir and compare an output of the simulated production from the oil and gas reservoir with a predetermined criterion. The computer executable instructions may also cause the computer processor to modify the at least one property to a different value within the data range for the property if the criterion is not met, and repeat simulation and comparison steps for two or more values for the at least one property that are within the data range.

In one or more embodiments, the computer executable instructions may further cause the computer processor to simulate production from the oil and gas reservoir with a second reservoir simulation model using the at least one property of the reservoir, the second reservoir simulation model being stored in the database. The computer executable instructions may then cause the computer processor to compare the simulated production from the oil and gas reservoir based on the second reservoir simulation model with a predetermined criterion, and modify the at least one property to a different value within the data range for the property if the criterion is not met. The simulation, comparison, and modification steps may thereafter be repeated for two or more values for the at least one property that are within the data range, and the outputs of the simulated productions for each of the first and second reservoir simulation models may be ranked.

In some embodiments, the system may further comprise any one of the following features individually or any two or more of these features in combination, in which the property of the reservoir comprises at least one of the permeability or porosity of the reservoir formation, the property of the reservoir comprises data representing the formation fluid, the property of the reservoir comprises data representing relative permeability, fluid pressure, fluid temperature, or capillary pressure of the reservoir formation, the property of the reservoir comprises at least one of the permeability or porosity of the reservoir formation, the property of the reservoir comprises static data reflecting an individual well location, and the data range for the at least one property is defined based on one of a Gaussian, Log-Normal, or Triangular distribution.

While the disclosed embodiments have been described with reference to one or more particular implementations, those skilled in the art will recognize that many changes may be made thereto without departing from the spirit and scope of the description. Accordingly, each of these embodiments and obvious variations thereof is contemplated as falling within the spirit and scope of the claims.

What is claimed is:
1. A method for optimizing production from an oil and gas reservoir comprising:
 a) selecting a geocellular grid, the geocellular grid including data representing petrophysical properties for the reservoir;
 b) defining a data range for at least one of the petrophysical properties based on a predefined constraint, the data range reflecting uncertainty regarding which values may be used for the at least one of the petrophysical properties and data type;
 c) selecting a first reservoir simulation model and a second reservoir simulation model for the reservoir, the first and second reservoir simulation models each using a different data value within the defined data range for the at least one of the petrophysical properties, respectively;

d) simulating oil or gas production from the reservoir using the at least one of the petrophysical properties as an input to the first reservoir simulation model, wherein the simulation includes performing a sensitivity analysis on the defined data range of the petrophysical properties associated with uncertainty by using sensitivity parameterization, wherein the data represents petrophysical properties for the reservoir reflecting simulation time control for an individual well location;

e) comparing an output of the simulated oil or gas production from the reservoir with a predetermined criterion, wherein the predetermined criterion is determined according to an accuracy of the simulation model with respect to production history;

f) modifying the data value for the at least one of the petrophysical properties to a different value within the defined data range, and repeating steps d-e for one or more modified values of the at least one of the petrophysical properties that are within the defined data range if the criterion is not met;

g) repeating steps d-f for the second reservoir simulation model after the predetermined criterion associated with the first reservoir simulation model is met; and h) ranking the outputs of the simulated productions that met the predetermined criterion for each of the first and second reservoir simulation models.

2. A method for optimizing production from an oil and gas reservoir according to claim 1 wherein the petrophysical properties of the reservoir comprise formation permeability and porosity for the reservoir.

3. A method for optimizing production from an oil and gas reservoir according to claim 1 wherein the petrophysical properties for the reservoir comprise formation fluid.

4. A method for optimizing production from an oil and gas reservoir according to claim 1 wherein the petrophysical properties for the reservoir comprise formation relative permeability, fluid pressure, fluid temperature, or capillary pressure of the reservoir.

5. A method for optimizing production from an oil and gas reservoir according to claim 1 wherein the predefined constraints is one of a Gaussian, Log-Normal, or Triangular distribution.

6. A method for optimizing production from an oil and gas reservoir according to claim 1 wherein the data representing the petrophysical properties for the reservoir comprises static data reflecting an individual well location.

7. A method for optimizing production from an oil and gas reservoir according to claim 1 wherein the data representing the petrophysical properties for the reservoir comprises data reflecting simulation controls for an individual well location.

8. A non-transitory computer readable medium having data stored thereon representing a geocellular grid for an oil and gas reservoir, the geocellular grid including data representing one or more petrophysical properties for the reservoir, and a set of instructions that when executed causes a computer processor to perform a method for optimizing production from the reservoir, including:

a) receiving a data range for at least one of the petrophysical properties that is defined based on a predefined constraint, the data range based on a priori uncertainty assessment of the reservoir, the data range reflecting uncertainty regarding which values may be used for the at least one of the petrophysical properties and data type;

b) receiving a first reservoir simulation model and a second reservoir simulation model for the reservoir, the first and second reservoir simulation models each using a different data value within the defined data range for the at least one of the petrophysical properties, respectively;

c) simulating production from the oil and gas reservoir using the at least one of the petrophysical properties as an input to the first reservoir simulation model wherein the simulation includes performing a sensitivity analysis on the defined data range of the petrophysical properties model associated with uncertainty by using sensitivity parameterization, wherein the data represents petrophysical properties for the reservoir reflecting simulation time control for an individual well location;

d) comparing an output of the simulated production from the oil and gas reservoir with a predetermined criterion, wherein the predetermined criterion is determined according to an accuracy of the simulation model with respect to production history;

e) modifying the data value for the at least one of the petrophysical properties to a different value within the defined data range, and repeating steps c-d for one or more modified values of the at least one of the petrophysical properties that are within the defined data range if the criterion is not met;

f) repeating steps c-e for the second reservoir simulation model after the predetermined criterion associated with the first reservoir simulation model is met; and i) ranking the outputs of the simulated productions that met the predetermined criterion for the first and second reservoir simulation models.

9. A non-transitory computer readable medium for optimizing production from an oil and gas reservoir according to claim 8 wherein the petrophysical properties for the reservoir comprise permeability or porosity of the reservoir.

10. A non-transitory computer readable medium for optimizing production from an oil and gas reservoir according to claim 8 wherein the petrophysical properties of the reservoir comprise formation fluid of the reservoir.

11. A non-transitory computer readable medium for optimizing production from an oil and gas reservoir according to claim 8 wherein the petrophysical properties of the reservoir comprise formation relative permeability, fluid pressure, fluid temperature, or capillary pressure of the reservoir.

12. A non-transitory computer readable medium for optimizing production from an oil and gas reservoir according to claim 8 wherein the predefined constraints is one of a Gaussian, Log-Normal, or Triangular distribution.

13. A non-transitory computer readable medium for optimizing production from an oil and gas reservoir according to claim 8 wherein the data representing the petrophysical properties for the reservoir comprises static data reflecting an individual well location.

14. A non-transitory computer readable medium for optimizing production from an oil and gas reservoir according to claim 8 wherein the data representing the petrophysical properties for the reservoir comprises data reflecting simulation controls for an individual well location.

15. A system for optimizing production from an oil and gas reservoir comprising: a computer processor; a database storing data representing one or more properties of an oil and gas reservoir and a geocellular model of the reservoir, the geocellular model composed of data representing at least one property of the reservoir, the database further storing a data range for the at least one property that is defined based on a predefined constraint, the data range reflecting uncertainty regarding which values may be used for the at least one of the petrophysical properties and data type; and data representing a first reservoir simulation model and a second reservoir simulation model, the first and second reservoir simulation models each using a different data value within the data range for the at least one property, respectively; and a computer memory having computer executable instructions that when executed cause the computer processor to:
  a) simulate production from the oil and gas reservoir using the at least one property as an input to the first reservoir simulation model, wherein the simulation includes performing a sensitivity analysis on the defined data range of the property associated with uncertainty by using sensitivity parameterization, wherein the data represents properties for the reservoir reflecting simulation time control for an individual well location;
  b) compare an output of the simulated production from the oil and gas reservoir with a predetermined criterion, wherein the predetermined criterion is determined according to an accuracy of the simulation model with respect to production history;
  c) modify the data value for the at least one property to a different value within the defined data range, and repeating steps a-b for one or more modified values of the at least one of the property that are within the defined data range for the property if the criterion is not met; and
  d) repeat steps a-c for the second reservoir simulation model after the predetermined criterion associated with the first reservoir simulation model is met.

16. A system for optimizing production from an oil and gas reservoir according to claim 15, wherein the computer executable instructions further cause the computer processor to:
  e) simulate production from the oil and gas reservoir using the at least one property of the reservoir as an input to the second reservoir simulation model, the second reservoir simulation model being stored in the database, wherein the simulation includes performing a sensitivity analysis on the defined data range of the property associated with uncertainty by using sensitivity parameterization, wherein the data represents properties for the reservoir reflecting simulation time control for an individual well location;
  f) compare the simulated production from the oil and gas reservoir based on the second reservoir simulation model with a second predetermined criterion, wherein the second predetermined criterion is determined according to an accuracy of the second simulation model with respect to production history;
  g) modify the data value for the at least one property to a different value within the data range for the property if the criterion is not met;
  h) repeat steps e-g for two or more values for the at least one property that are within the defined data range, and repeating steps e-g for one or more modified values of the at least one property that are within the defined data range; and
  i) rank the outputs of the simulated productions that met the first and second predetermined criterion, respectively, for each of the first and second reservoir simulation models.

17. A system for optimizing production from an oil and gas reservoir according to claim 15 wherein the predefined constraints is one of a Gaussian, Log-Normal, or Triangular distribution.

18. A system for optimizing production from an oil and gas reservoir according to claim 15 wherein the property of the reservoir comprises data representing formation relative permeability, fluid pressure, fluid temperature, or capillary pressure of the reservoir.

19. A system for optimizing production from an oil and gas reservoir according to claim 15 wherein the property of the reservoir comprises at least one of formation permeability or porosity of the reservoir.

20. A system for optimizing production from an oil and gas reservoir according to claim 15 wherein the property of the reservoir comprises static data reflecting an individual well location.

* * * * *